(12) United States Patent
Giacomini et al.

(10) Patent No.: US 10,651,641 B2
(45) Date of Patent: May 12, 2020

(54) ELECTRONIC DEVICE PROTECTION CIRCUIT, CORRESPONDING DEVICE AND METHOD

(71) Applicants: STMicroelectronics S.r.l., Agrate Brianza (IT); STMicroelectronics International N.V., Schiphol (NL)

(72) Inventors: Mauro Giacomini, Bergamo (IT); Rajesh Narwal, Greater Noida (IN); Pravesh Kumar Saini, Greater Nodia (IN)

(73) Assignees: STMICROELECTRONICS INTERNATIONAL N.V., Amsterdam (NL); STMICROELECTRONICS S.R.L., Agrate Brianza (MB) (IT)

( * ) Notice: Subject to any disclaimer, the term of this patent is extended or adjusted under 35 U.S.C. 154(b) by 365 days.

(21) Appl. No.: 15/637,766

(22) Filed: Jun. 29, 2017

(65) Prior Publication Data

US 2018/0175606 A1 Jun. 21, 2018

(30) Foreign Application Priority Data

Dec. 16, 2016 (IT) .......................... 102016000127322

(51) Int. Cl.
*H02H 3/00* (2006.01)
*H02H 3/087* (2006.01)
(Continued)

(52) U.S. Cl.
CPC ......... *H02H 3/087* (2013.01); *H01L 27/0248* (2013.01); *H02H 3/04* (2013.01); *H02H 3/20* (2013.01); *H02H 7/20* (2013.01); *H02H 9/042* (2013.01); *H02H 9/046* (2013.01); *H02J 9/061* (2013.01)

(58) Field of Classification Search
None
See application file for complete search history.

(56) References Cited

U.S. PATENT DOCUMENTS

| 5,508,649 | A | 4/1996 | Shay |
| 8,605,398 | B2 * | 12/2013 | Bode ................ H03K 19/00315 361/111 |

(Continued)

FOREIGN PATENT DOCUMENTS

| CN | 102474094 A | 5/2012 |
| CN | 104037719 A | 9/2014 |

(Continued)

*Primary Examiner* — Stephen W Jackson
(74) *Attorney, Agent, or Firm* — Slater Matsil, LLP

(57) ABSTRACT

A circuit includes an input terminal and a regulated supply line for supplying an electronic device with an electrostatic discharge protection and driver circuit for the electronic device. The supply line is coupled to the input terminal via the circuitry, so that current injected into the input terminal may produce a voltage increase on the regulated supply line. A comparator sensitive to the voltage at the input terminal and the voltage on the supply line is provided. A current sink coupled with the supply line and being activatable to sink current from the supply line is also provided. The comparator is configured for activating the current sink as a result of the voltage at the input terminal exceeding the voltage on the supply line of a certain intervention threshold.

20 Claims, 2 Drawing Sheets

(51) Int. Cl.
*H02H 9/04* (2006.01)
*H01L 27/02* (2006.01)
*H02H 3/04* (2006.01)
*H02H 3/20* (2006.01)
*H02H 7/20* (2006.01)
*H02J 9/06* (2006.01)

(56) References Cited

U.S. PATENT DOCUMENTS 9,484,740 B2 \* 11/2016 Venkatasubramanian ................... H02H 9/041
2008/0130181 A1 6/2008 Pinna et al.
2008/0304191 A1 12/2008 Riviere et al.
2016/0301203 A1 10/2016 Curry

FOREIGN PATENT DOCUMENTS

| CN | 207053483 U | 2/2018 |
| EP | 2462671 A1 | 6/2012 |
| WO | 2015183428 A1 | 12/2015 |

\* cited by examiner

ELECTRONIC DEVICE PROTECTION CIRCUIT, CORRESPONDING DEVICE AND METHOD

CROSS-REFERENCE TO RELATED APPLICATIONS

This application claims priority to Italian Patent Application No. 102016000127322, filed on Dec. 16, 2016, which application is hereby incorporated herein by reference.

TECHNICAL FIELD

The description relates to electronic device protection circuits.

BACKGROUND

The ability to support current injection specifications (for instance 5 mA) on multiple channels, such as multiple ADC channels, may represent an asset in various devices, e.g., in the automotive area.

A supply voltage configuration such that, for instance, IO (Input/Output) and ADC supplies may be different may represent an appreciated feature in various applications.

A way of complying with such a requirement is to separate an ADC cluster IO ring from the rest of the IO ring such that both rings can be supplied by a dedicated supply unit.

In various applications, the overall current consumption of the ADC plus the ADC IO ring may be small, so that an injected current of, say, 6.5 mA per channel may be at the basis of reliability issues e.g. if the sum of the total injected current exceeds the total consumption on an ADC supply.

An injected current in the input channel may be collected by the supply of the IO ring. If the consumption on the IO ring is lower than the total injected current, then a supply voltage on the IO ring can rise beyond a specification limit, this being possibly the case when an external regulator is of the source type.

U.S. Pat. No. 8,605,398 B1 is exemplary of a solution including a closed loop around a pad terminal. An arrangement as disclosed in that document may be difficult to stabilize insofar as stability may depend on an external capacitance on the pad terminal, which may vary e.g. in a picoFarad to microFarad range. Leakage currents from an additional source and a sink MOS transistor may also limit performance.

SUMMARY

One or more embodiments of the present invention can be applied, e.g., to input/output (IO) and/or analog-to-digital converter (ADC) supply devices for use, e.g., in the automotive area. One or more embodiments dispense with drawbacks of such known arrangements.

According to one or more embodiments, a circuit comprises an input terminal, a regulated supply line for supplying an electronic device, and electrostatic discharge protection and driver circuitry for the electronic device. The regulated supply line is coupled to the input terminal via the electrostatic discharge protection and driver circuitry. Current injected into the input terminal produces a voltage increase at the regulated supply line. A comparator sensitive to a voltage at the input terminal and a voltage at the regulated supply line is provided. A current sink is coupled with the regulated supply line. The current sink is activatable to sink current from the regulated supply line. The current sink is coupled with the comparator. The comparator is configured for activating the current sink as a result of the voltage at the input terminal exceeding the voltage at the regulated supply line by a first threshold.

One or more embodiments may also relate to a corresponding device and to a corresponding method.

Operation of one or more embodiments may be based on detecting a current injection on an input channel and correspondingly increasing the consumption on the, e.g., iO supply such that total current consumption in the IO ring may be maintained at a higher level than the total injected current.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
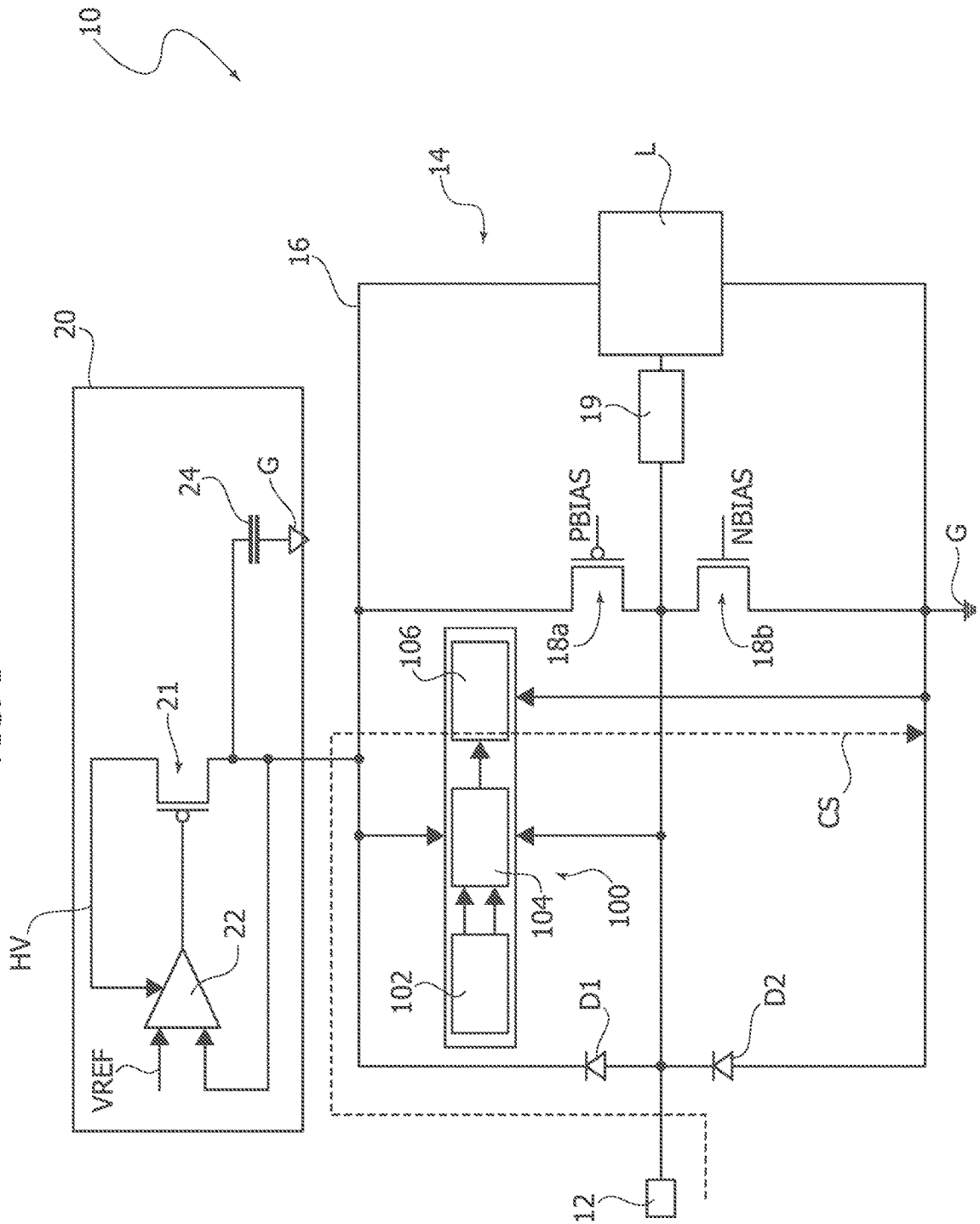
FIG. 1 is a block diagram exemplary of one or more embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference number 10 denotes as a whole a circuit for supplying a load L (which may include, e.g., an analog-to-digital converter or ADC) from an input terminal (pad).

It will be appreciated that the load L may be a distinct element from the embodiments and/or include a device other than an ADC converter.

The terminal 12 may be a single terminal or may be a schematic representation for a plurality of terminals or pins. A terminal may be, e.g., an input terminal for receiving electrical signals from an external device (not visible in the figures) coupled to the terminal 12.

In one or more embodiments, the ADC exemplary of the load L may be coupled to the terminal 12 via a driver circuit 14 acting as ESD (ElectroStatic Discharge) and input/output (IO) driver circuit around the pad terminal 12.

One or more embodiments may take into account that excessive ESD, e.g., when an electronic device such as the ADC L is connected to an external terminal or pin such as the pad 12, may result in current injection. ESD may result in a sudden and momentary electric current flowing between two objects at different electrostatic potentials, caused by direct contact or induced by an electrostatic field. ESD may for example be caused by human handling of a chip. It can result from electrostatic electricity, for example caused by tribocharging or by electrostatic induction when an electrically charged object is placed near a conductive object isolated from ground. An ESD event may occur when this object comes into contact with a conductive path. Due to size reduction in IC technologies, reduction of layer sizes may increase a circuit sensitivity against ESD. Therefore, ESD protection may play a role in various applications. Current injection into pins or terminals of a semiconductor device may for example lead to device malfunction due to carrier interaction in the substrate or unwanted supply level modification which may hamper correct operation of the device or damage the device.

In one or more embodiments, the circuit 14 may be set between an input/output (iO) supply line 16 and ground G.

In one or more embodiments, the circuit may include a pair of diodes D1, D2 arranged in series between the IO supply line 16 and ground G with their cathodes towards the supply lines 16 and the terminal 12 (pad) coupled to the intermediate point between the diodes D1, D2.

In one or more embodiments, the circuit 14 may also include a pair of transistors 18a, 18b set between the IO line 16 and ground G with their current paths (source-drain, in the case of field effect transistors) arranged in series with each other.

In one or more embodiments, the transistors 18a, 18b may include MOSFETS having their control terminals (gates) biased at voltages PBIAS (with an input inverter) and NBIAS.

In one or more embodiments, the pin (pad) 12 may be coupled with the intermediate point between the diodes D1 and D2 as well as with the intermediate point between the transistors 18a, 18b.

In an arrangement as exemplified in FIG. 1, the signal output from the pad terminal 12 may thus proceed towards the load L (e.g., an ADC) via a resistor 19 arranged between the intermediate point between the transistors 18a, 18b and the ADC.

Reference 20 denotes as a whole an external regulator.

In one or more embodiments, the regulator 20 may include a linear regulator used to drive the IO supply line 16.

In one or more embodiments, the regulator 20 may include a (power) transistor 21 arranged with its current path (source-drain, in the case of a FET) set between a (high voltage) supply line (HV) and the IO supply line 16 of the circuit 10.

In one or more embodiments, the control terminal (e.g., gate, in the case of a FET such as a MOSFET transistor) of the transistor 21 may be coupled (possibly with logic inversion) to the output of an error amplifier 22 configured for comparing the voltage on the supply line 16 with a reference voltage VREF.

In one or more embodiments, a (stabilization) capacitor 24 may be arranged between the output of the power transistor 21 (that is the terminal coupled with the IO supply line 16) and the (chip) ground G.

The voltage VREF may be an external reference voltage which is tracked by the regulator 20 to regulate the IO supply line 16 from the external regulator supply voltage HV via the power transistor 21.

A positive (current) injection on the terminal (pad) 12 may result in the (ESD) diode D1 becoming conductive so that injected current may flow into the capacitor 24 and charge it to a voltage level beyond a specification for the IO supply line 16. This may occur, e.g., if the device consumption is smaller than this injected current.

In that respect it will be appreciated that current injection may occur on various pads (that is on various terminals 12).

Consequently, maintaining the IO supply line 16 within a given specification may be facilitated if the total injected current remains lower than the total current taken from the IO supply line 16, which may result in a limitation on the maximum injected current or the maximum number of channels where injection may take place.

In one or more embodiments, such an undesired type of operation may be countered by including in the circuit 14 a unit or module 100.

In one or more embodiments the unit or module 100 may include a level shifter 102, a comparator 104 and a current sink 106.

It will be otherwise appreciated that: in one or more embodiments not all such elements may be present, and/or in one or more embodiments any one of such elements may be substituted by alternative circuits.

In one or more embodiments the comparator 104 may be configured in order to sense (possibly with the cooperation of the level shifter 102, as discussed in the following) the voltage at the pad terminal 12 and the voltage on the IO supply line 16 and possibly activate the current sink 106 as a result of the voltage at the pad terminal 12 exceeding the voltage on the IO supply line 16, e.g., of a certain intervention threshold (e.g., 250 mV).

As a result of being activated, the current sink 106 may sink current from the line 16 (and thus from the capacitor 24) as schematically indicated by the dashed line CS in FIG. 1 thus facilitating achieving a condition where the current on the IO supply line 16 is higher than the current injected into the pad terminal 12. For instance, in one or more embodiments, the current sink 106 may be designed having regard to a peak injected current specification for, e.g., a single IO pad.

In one or more embodiments a circuit as exemplified herein may use an open loop around the pad terminal 12 so that using a stability capacitance on the pad terminal may be avoided. It will be however appreciated that such a capacitor may be adopted, e.g., at a customer level in order to comply with certain requirements without however such a capacitor having to be taken into account by a current injection detection logic.

Figure 2:
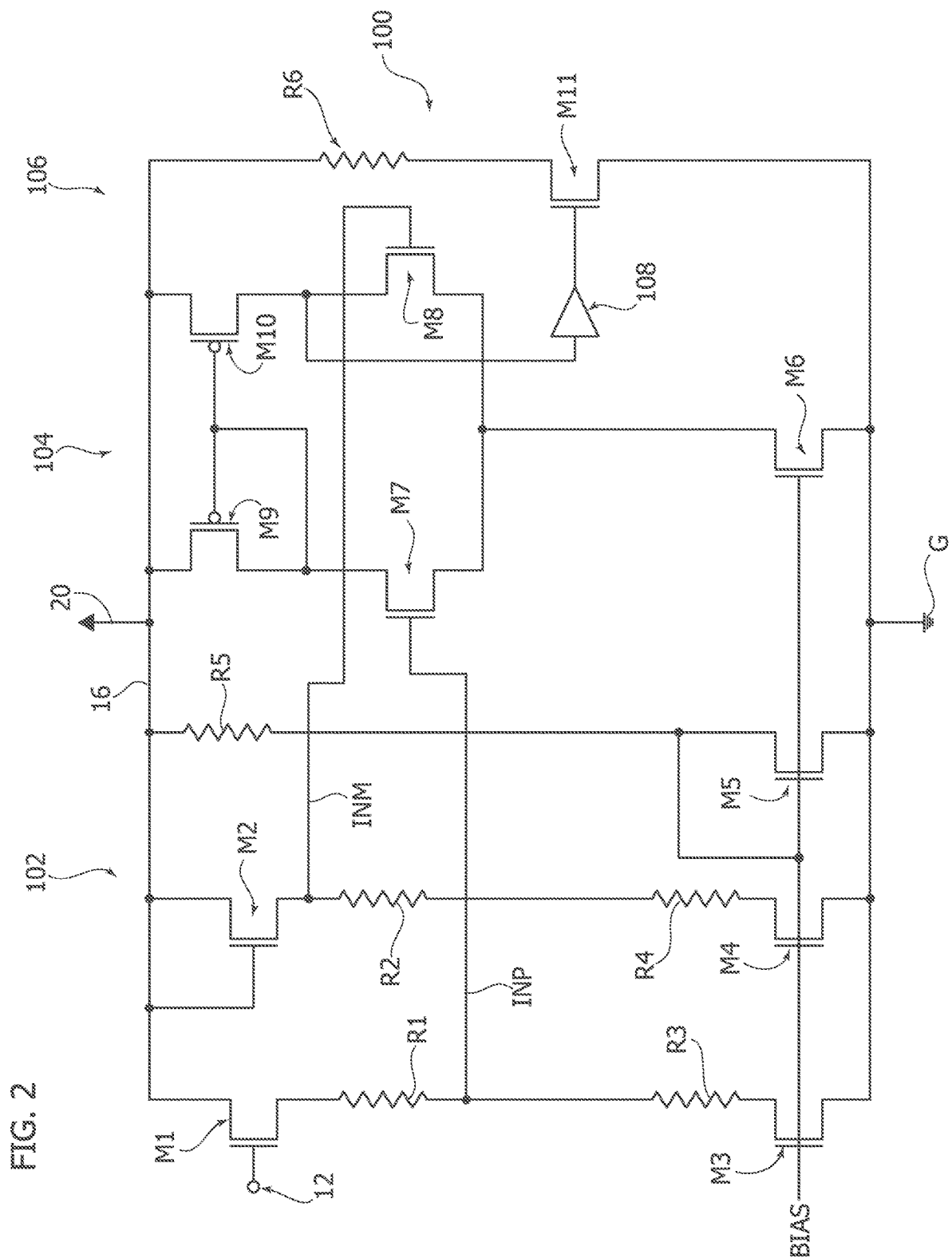
FIG. 2 is a circuit diagram exemplary of one or more embodiments.

The diagram of FIG. 2 is exemplary of a possible circuit implementation of the level shifter 102, the comparator 104 and the current sink 106.

For instance, in one or more embodiments the signal level at the pad terminal 12 and the supply line 16 are level-shifted using two transistors M1 and M2 (e.g., MOSFET transistors) in a source follower configuration.

In one or more embodiments, the connection layout of the transistor M1 may include the transistor M1 having the pin (pad) 12 coupled to its control terminal (e.g., gate, in the case of a FET) with the transistor M1 included in a series connection including, between the supply line 16 and ground G: the transistor M1, referred to the supply line 16; a resistor R1 and a resistor R3; and a further (bias) transistor M3 (e.g., a MOSFET transistor), referred to ground G.

In one or more embodiments, the connection layout of the transistor M2 may include the transistor M2 having the supply line 16 coupled to its control terminal (e.g., gate, in the case of a FET) with the transistor M2 included in a series connection including, between the supply line 16 and ground G: the transistor M2, referred to the supply line 16; a resistor R2 and a resistor R4; and a further (bias) transistor M4 (e.g., a MOSFET transistor), referred to ground G.

In one or more embodiments, level-shifted signals INP and INM may thus be available at the intermediate point of the voltage divider R1, R3 (INP) and between the transistor M2 and the resistors R2, R4 (INM), having a DC offset with respect to the voltages at the pad terminal 12 and at the IO supply line 16 respectively.

In one or more embodiments, INM may be "tapped" between the source of M2 and R2, and the resistance value of the combination of R2 and R4 may be used to create an offset between INM and INP with an adequate common mode voltage.

In one or more embodiments, the level-shifted signals INP, INM may be fed to the differential inputs of a comparator 104 including, e.g., two transistor pairs M7, M9 and M8, M10 (e.g., MOSFET transistors) according to a conventional comparator arrangement, biased, e.g., via a further transistor (e.g., MOSFET) M6.

In one or more embodiments the DC offset possibly added by the level shifter 102 may facilitate achieving a condition where the current sink 106 is activated (only) as a result of the voltage on the pad terminal 12 exceeding the voltage on the supply line 16 by a given (threshold) value.

As already discussed, a current injection into the pad terminal 12 may result in the pad voltage to start increasing. In one or more embodiments, the voltage on the pad terminal 12 exceeding the voltage on the IO supply line 16 of, e.g., 250 mV may cause the comparator 104 to turn on (e.g., make conductive) a current sink switch (e.g., a transistor such as a MOSFET M11), possibly driven by the output of the comparator 104 via a buffer 108.

This will result in the total consumption on the IO supply line 16 being increased so that the consumption on the IO supply line 16 remains higher than the injected current.

In one or more embodiments, the current sink specification may be set as a function of the peak current which may be injected in the supply line of the input channel.

In one or more embodiments such a specification may be set by selecting the resistance value of a resistor R6 set in the current path (source-drain, in the case of a FET) of the switch M11 between the IO supply line 16 and ground G.

In one or more embodiments activation of the protection circuit along the line discussed in the foregoing facilitates achieving a condition where the total injected current in the system does not exceed the total IO ring consumption thus protecting the device, e.g., the ADC exemplary of the load L from over-voltage threats.

In one or more embodiments, a supply-dependent bias network for the unit or module 100 may include a transistor M5 (e.g., a MOSFET) and a resistor R5 set in the current path (source-drain, in the case of a FET) of the transistor M5 between the IO supply line 16 and ground G.

In one or more embodiments, the level shifter 102 and the comparator 104 may thus be biased using resistors only thus avoiding using for that purpose a current generator, with various current sinks adapted to be replaced by resistors.

In one or more embodiments use of separate wells may be avoided for the level shifter transistors (e.g., M1 and M2), thus facilitating saving silicon area. One or more embodiments may resort to separate wells thus facilitating removing body bias effects.

In one or more embodiments supply-dependent biasing facilitates operation of the circuit over a wide range of possible supply variations while also reducing possible PVT (Process-Voltage-Temperature) variations of the detection threshold voltage which leads to the current sink 106 (transistor M11) being turned on (i.e. made conductive).

One or more embodiments may adopt alternative schemes of current generation which are known in the art.

In one or more embodiments, output from the comparator 106 may be buffered (e.g., 108) by using a simple (e.g., CMOS) buffer which facilitates driving the switch M11 of the current sink 106.

One or more embodiments may use, e.g., a MOS transistor without a resistor as a current sink, with a certain penalty in accuracy.

In one or more embodiments, a constant current sink may be used in the place of a resistor, e.g., R6 for setting the value of the sink current.

One or more embodiments may thus provide a circuit (e.g., 10), including: an input terminal (e.g., "pad" 12), a regulated (e.g., 20) supply line (e.g., 16) for supplying an electronic device (L, e.g., an ADC), electrostatic discharge protection and driver circuitry (e.g., D1, D2, 18a, 18b, 19) for the electronic device where the supply line is coupled to the input terminal via the circuitry (e.g., via diode D1), where current injected into the input terminal produces a voltage increase at the regulated supply line, a comparator (e.g., 104) sensitive to the voltage at the input terminal and the voltage at the supply line, and a current sink (e.g., 106) coupled with the supply line, the current sink activatable (e.g., 108, M11) to sink current from the supply line, the current sink coupled with the comparator, where the comparator is configured for activating the current sink as a result of the voltage at the input terminal exceeding the voltage at the supply line of a certain intervention threshold.

One or more embodiments may include a level shifter (e.g., 102) having inputs (e.g., M1, M2) coupled with the input terminal and the supply line and providing the comparator with level-shifted replicas (e.g., INP, INM) of the voltage at the terminal and the voltage at the supply line.

In one or more embodiments, the level shifter may include source-follower inputs (e.g., M1, M2) coupled with the input terminal and the supply line.

One or more embodiments may include a supply-dependent bias network (e.g., R5, M5).

In one or more embodiments, the comparator may include an output buffer (e.g., 108), optionally a CMOS buffer, driving the current sink.

In one or more embodiments, the current sink may include: an electronic switch (e.g., M11) providing a current sink path between the supply line and ground (e.g., G), and a resistor (e.g., R6) in the current sink path.

In one or more embodiments, an electronic device may include: a circuit according to one or more embodiments, and a supplied electronic device (e.g., L) coupled with the supply line.

In one or more embodiments, the supplied electronic device may include an analog-to-digital converter.

In one or more embodiments a method of supplying an electronic device via a regulated supply line may include: providing an input terminal coupled to the supply line via an electrostatic discharge protection and driver circuitry where a current injected into the input terminal produces a voltage increase on the regulated supply line, providing a current sink coupled with the supply line, the current sink activatable to sink current from the supply line, sensing the voltage at the input terminal and the voltage at the supply line, and activating the current sink to sink current from the supply line as a result of the voltage at the terminal exceeding the voltage on the supply line by a certain intervention threshold.

Without prejudice to the underlined principles, the details and embodiments may vary, even significantly, with respect to what has been described herein merely by way of example, without departing from the extent of protection.

The extent of protection is defined by the annexed claims.

What is claimed is:

1. A circuit comprising:
   an input terminal;
   a regulated supply line for supplying an electronic device;
   a second supply line;
   an electrostatic discharge protection and driver circuit for the electronic device, wherein the regulated supply line is coupled to the input terminal via the electrostatic discharge protection and driver circuit, and wherein current injected into the input terminal is configured to produce a voltage increase at the regulated supply line;
   a comparator sensitive to a voltage at the input terminal and a voltage at the regulated supply line;
   a current sink coupled between the regulated supply line and the second supply line, and further coupled to the comparator, the current sink activatable to sink current from the regulated supply line into the second supply line, wherein the comparator is configured for activating the current sink as a result of the voltage at the input terminal exceeding the voltage at the regulated supply line by a first threshold; and
   a level shifter having inputs coupled to the input terminal and to the regulated supply line, the level shifter configured to provide the comparator with level-shifted replicas of the voltage at the input terminal and the voltage at the regulated supply line.

2. The circuit of claim 1, wherein:
   the electrostatic discharge protection and driver circuit comprises a first diode; and
   the regulated supply line is coupled to the input terminal via the first diode.

3. The circuit of claim 1, wherein the level shifter comprises source-follower inputs coupled to the input terminal and to the regulated supply line.

4. The circuit of claim 1, further comprising a supply-dependent bias network.

5. The circuit of claim 1, wherein the comparator comprises an output buffer.

6. The circuit of claim 5, wherein the output buffer comprises a CMOS buffer configured to drive the current sink.

7. The circuit of claim 1, wherein the current sink comprises:
   an electronic switch having a current sink path between the regulated supply line and a reference terminal; and
   a resistor in the current sink path.

8. The circuit of claim 7, wherein the reference terminal is coupled to ground.

9. The circuit of claim 1, wherein the first threshold is about 250 mV.

10. An electronic device, comprising:
    an input terminal;
    a first supply terminal configured to be coupled to a voltage regulator;
    a comparator having a first input coupled to the input terminal and a second input coupled to the first supply terminal;
    a level shifter coupled to the first and second inputs of the comparator and configured to provide to the first and second inputs of the comparator with level-shifted replicas of a voltage at the input terminal and a voltage at the first supply terminal, respectively; and
    a current sink coupled between the first supply terminal and a second supply terminal and configured to sink current from the first supply terminal into the second supply terminal based on an output of the comparator, wherein the input terminal is configured to be coupled to a load.

11. The electronic device of claim 10, further comprising the voltage regulator, wherein the voltage regulator comprises a linear voltage regulator and wherein the first supply terminal is coupled to the voltage regulator.

12. The electronic device of claim 10, wherein the second supply terminal is coupled to ground.

13. The electronic device of claim 10, further comprising the load, wherein the load comprises an analog-to-digital converter (ADC) and is coupled to the input terminal.

14. The electronic device of claim 13, wherein the ADC is further coupled between the first supply terminal and the second supply terminal.

15. The electronic device of claim 10, wherein the level shifter comprises:
    a first transistor coupled to the first input of the comparator, the first transistor having a gate coupled to the input terminal; and
    a second transistor coupled to the second input of the comparator, the second transistor having a gate coupled to the first supply terminal.

16. The electronic device of claim 10, wherein the current sink comprises:
    a third transistor coupled between the first supply terminal and the second supply terminal;
    a first resistor in series with the third transistor; and
    a gate of the third transistor is coupled to an output of the comparator.

17. A method for supplying a regulated voltage to an electronic device via a regulated supply line, the method comprising:
    receiving an input voltage at an input terminal, the input terminal being coupled to the regulated supply line via an electrostatic discharge protection and driver circuit, wherein a current injected into the input terminal produces a voltage increase on the regulated supply line;
    level-shifting the input voltage and the regulated voltage with a level shifter to generate a level-shifted input voltage and a level-shifted regulated voltage;
    sensing the level-shifted input voltage and the level-shifted regulated voltage with a comparator; and
    activating, with an output of the comparator, a current sink coupled to the regulated supply line to sink current from the regulated supply line into a second supply line as a result of the input voltage exceeding the regulated voltage by an intervention threshold.

18. The method of claim 17, wherein level-shifting the input voltage and the regulated voltage comprises uses source followers of the level shifter.

19. The electronic device of claim 15, further comprising:
    a third transistor coupled between the first transistor and the second supply terminal;
    a fourth transistor coupled between the first supply terminal and the second supply terminal and having a gate coupled to a gate of the third transistor; and
    a first resistor coupled between the first supply terminal and the fourth transistor.

20. The electronic device of claim 16, wherein the output of the comparator is coupled to the gate of the third transistor via a CMOS buffer.

\* \* \* \* \*